(12) United States Patent
Wiley

(10) Patent No.: US 7,342,198 B2
(45) Date of Patent: Mar. 11, 2008

(54) METHOD AND APPARATUS FOR GENERATING AN ELECTRICAL ARC

(75) Inventor: Robert G. Wiley, Frankfort, KY (US)

(73) Assignee: 3SAE Technologies, Inc., Franklin, TN (US)

(*) Notice: Subject to any disclaimer, the term of this patent is extended or adjusted under 35 U.S.C. 154(b) by 0 days.

(21) Appl. No.: 11/678,671

(22) Filed: Feb. 26, 2007

(65) Prior Publication Data

US 2007/0193983 A1    Aug. 23, 2007

Related U.S. Application Data

(63) Continuation-in-part of application No. 11/294,037, filed on Dec. 5, 2005, which is a continuation of application No. 11/198,363, filed on Aug. 5, 2005.

(51) Int. Cl.
*B23K 10/00* (2006.01)

(52) U.S. Cl. ............... 219/121.59; 219/121.57; 219/121.52; 219/121.48; 315/111.21

(58) Field of Classification Search ........... 219/121.59, 219/121.51, 121.36, 121.52, 121.48, 74, 219/75; 313/231.31, 231.41; 315/111.21, 315/111.51; 372/73–87
See application file for complete search history.

(56) References Cited

U.S. PATENT DOCUMENTS

| | | | |
|---|---|---|---|
| 3,576,422 A | 4/1971 | Beaupre et al. |
| 4,123,646 A | 10/1978 | Keinanen |
| 4,210,877 A | 7/1980 | Pleasance et al. |
| 4,388,512 A | 6/1983 | Salzer et al. |
| 4,388,513 A | 6/1983 | Brastow et al. |
| 4,855,566 A | 8/1989 | Hays et al. |
| 5,006,688 A | 4/1991 | Cross |
| 5,705,790 A | 1/1998 | Klebl et al. |
| 6,075,224 A | 6/2000 | De Coster |
| 6,541,915 B2 | 4/2003 | Eden et al. |
| 2004/0091220 A1 | 5/2004 | Tanabe |
| 2005/0041938 A1 | 2/2005 | Hattori et al. |
| 2005/0226791 A1 | 10/2005 | Wada et al. |

*Primary Examiner*—Mark Paschall
(74) *Attorney, Agent, or Firm*—Philip E. Levy; Eckert Seamans Cherin & Mellott, LLC

(57) ABSTRACT

A method of generating an electrical arc includes steps of providing a first electrode and a second electrode, determining a dielectric strength of a gap region between the electrodes, determining a desired dielectric strength change based on the determined dielectric strength, injecting an amount of ions into the gap region, wherein the amount of ions is controlled based on the desired dielectric strength change, and providing a voltage to the first electrode, the voltage causing the electrical arc to be formed between the first electrode and the second electrode. Preferably, the amount of ions injected into the gap region causes the dielectric strength of the gap region to be changed by an amount substantially equal to the desired dieletric strength change. The method may be implemented in an apparatus employing an electrician arc, such as, without limitation, a fusion splicer or an apparatus for preparing an optical fiber.

22 Claims, 5 Drawing Sheets

METHOD AND APPARATUS FOR GENERATING AN ELECTRICAL ARC

CROSS REFERENCE TO RELATED APPLICATION

The present application is a continuation-in-part of U.S. Ser. No. 11/294,037, filed Dec. 5, 2005, which application is a continuation of U.S. Ser. No. 11/198,363, filed Aug. 5, 2005.

BACKGROUND OF THE INVENTION

1. Field of the Invention

The present invention relates to the generation of an electrical arc, such as may be used for cleaning and/or stripping an optical fiber or fusion splicing one optical fiber to another optical fiber.

2. Description of the Prior Art

Fiber optic cables are widely used in modern optical devices and optical communications systems. Optical fibers are strands of glass fiber processed so that light beams transmitted through the glass fiber are subject to total internal reflection wherein a large fraction of the incident intensity of light directed into the fiber is received at the other end of the fiber. In addition, a number of individual optical fibers may be grouped together to form what is known as a ribbon fiber.

For some applications, the optical fiber or fibers must be many kilometers long. It is therefore often necessary to splice two shorter lengths of optical fiber (a single fiber or a ribbon fiber) together to form a longer optical fiber. The need to splice optical fibers also arises when it is necessary to use a length longer than can be made from a single preform, when an existing length of fiber breaks, or when apparatus such as an amplifier is to be incorporated into a length of fiber.

Optical fibers are usually coated with one or more protective layers, for example a polymer coating made of acrylate or polyimide, in order to protect the surface of the fiber from chemical or mechanical damage. In order to prepare the fibers to be cleaved and spliced, or in order to further process the fibers to manufacture optical devices such as optical sensors and other optical communications network components, it is necessary to remove the protective coating or coatings, a process known as stripping, and to clean the optical fiber to remove any remaining coating debris.

Conventional stripping methods include mechanical stripping, chemical stripping, and thermal stripping. Mechanical stripping typically involves a stripping tool, similar to a wire stripper, which cuts through the coating and scrapes it off. Mechanical stripping may result in nicks or scratches on the glass fiber surface, which could lead to cracks and degradation in the tensile strength of the fiber. Chemical stripping uses solvents or concentrated acids to remove the polymer coating. Chemical stripping is typically very costly, presents safety concerns due to the nature of the chemicals that are used, and, in some cases, may adversely affect the splice strength.

Moreover, conventional cleaning methods include chemical cleaning and electrical arc based cleaning. For example, prior art fusion splicing devices have typically cleaned optical fibers prior to splicing in two steps. In a first step, a chemical, typically alcohol, is used to remove large debris (large coating particles) from the cleaved end of the optical fiber that is left behind following the stripping step. Then, in a second step, a single electrical arc pulse, commonly referred to as a "prefuse arc," is used to remove any small debris (smaller coating particles) that may remain after the chemical cleaning step. In particular, in this second step, the "prefuse arc" generates a plasma, and the cleaved end of the fiber is inserted into the plasma. The intense heat of the plasma vaporizes the remaining small debris. The prior, extra chemical cleaning step is necessary because using the "prefuse arc" and resulting plasma to remove large debris would result in the contamination of the electrodes, v-grooves and optics of the fusion splicer due to the sputtering of the large debris.

Thus, there is a need for an improved method of stripping and/or cleaning an optical fiber prior to splicing and/or cleaving steps.

In addition, in many applications that require an arc, the voltage potential between the electrodes is simply increased until a spark occurs. Once a spark occurs, the gas or gasses, such as air, between the electrodes becomes ionized. Since ionized gasses, such as air, are conductors rather than insulators, the arc, resulting from the spark, can then be maintained easily by current regulation. Because of the fact that the gas or gasses, such as air, typically have a huge resistance to current flow until dielectric breakdown and effectively a negative resistance afterwards, highly complex and costly circuits are required to compensate and prevent system meltdown resulting from the relatively high applied voltages. In addition, in some applications, there may be a practical limit to the magnitude of voltage that can be applied to the electrode. Similarly, in many applications, it is advantageous to limit the magnitude of voltage that is required to generate an electrical arc so that smaller, less complex and less expensive electrical components may be used. Finally, a number of other factors also somewhat affect the dielectric strength of a fixed length gap between two electrodes, including humidity, pressure/altitude, gasses present, natural radioactivity, cosmic rays, and electrode condition. To the extent that any of these factors increase dielectric strength and gap resistance, a larger voltage will be required to generate an electrical arc between the two electrodes.

Thus, there is also a need for an improved method and an improved apparatus for generating an electrical arc, such as may be used for cleaning and/or stripping an optical fiber or fusion splicing one optical fiber to another optical fiber.

SUMMARY OF THE INVENTION

The present invention relates to a method of processing an optical fiber, such as a single optical fiber or a ribbon fiber, that includes generating an electrical arc in a first area wherein the electrical arc creates a plasma in one or more gasses located in the first area. The plasma that is generated is in a region referred to as the plasma region. The method further includes positioning a portion of the optical fiber in a second area that is adjacent to and outside of the plasma region, wherein coating material that is present on the portion of the optical fiber is removed when the plasma is present and the portion of the optical fiber is positioned in the second area. The positioning step may be performed prior to or subsequent to the arc generating step.

In one embodiment, the method is used for cleaning the optical fiber. In this case, the optical fiber includes at least one coating layer and the portion of the optical fiber is a stripped portion of the optical fiber formed by removing nearly all of the at least one coating layer therefrom. The coating material in this embodiment comprises coating material debris that is left on the stripped portion of the optical fiber.

In another embodiment, the method is used for stripping the optical fiber. In this case, the coating material comprises nearly all of the at least one coating layer that is present at the portion of the optical fiber that is position in the second area.

The method may also further include translating the portion of said optical fiber that is positioned in the second area relative to the plasma region when the plasma is present. Preferably, the translating step is performed at a rate of between approximately 0.1 mm/second and approximately 100 mm/second.

The electrical arc is generated along a first axis and the optical fiber has a longitudinal axis. The positioning step may include positioning the optical fiber such that the longitudinal axis is generally perpendicular to said first axis. Alternatively, the positioning step may include positioning the optical fiber such that the longitudinal axis is generally parallel to the first axis.

The electrical arc may be continuous electrical arc. The electrical arc may also be a pulsed electrical arc. Preferably, the pulsed electrical arc is generated at a frequency of about 15 KHz at a 50% duty cycle. In addition, the generating step may further include turning the pulsed electrical arc on and off at a ratio separate from the primary duty cycle, wherein the ratio is selectable by a user and comprises repeatedly turning the pulsed electrical arc on for a first time period and off for a second time period. For example, the first time period may be approximately 50 ms and the second time period may one of approximately 150 ms, approximately 121 ms, approximately 88 ms, and approximately 50 ms.

The one or more gasses in which the plasma is generated may include air, $CO_2$, or an inert gas such as nitrogen or argon. Preferably, the one or more gasses include a gas that removes one or both of oxygen and humidity from the first area, or a gas that reduces the dielectric strength in the first area.

In one alternative embodiment, the method includes generating a pulsed electrical arc in a first area, wherein the pulsed electrical arc creates a plasma in a plasma region in one or more gasses located in the first area. The method further includes positioning a portion of the optical fiber at least partially within the plasma region. According to the method, coating material that is present on the portion of the optical fiber is removed when the plasma is present and that portion is positioned at least partially within the plasma region. The positioning step may be performed prior to or subsequent to the generating step. The various alternative described above may also be employed in this embodiment.

The present invention also relates to an apparatus for preparing an optical fiber having at least one coating layer that includes stripping module for removing nearly all of the at least one coating layer present at a portion of the optical fiber, a cleaning module, a cleaving module for cleaving an end of the optical fiber, and a fiber holding mechanism for holding the optical fiber and moving the optical fiber among the stripping module, the cleaning module and the cleaving module. The cleaning module includes a first electrode and a second electrode. An electrical arc is selectively generated in a first area between the first electrode and the second electrode. The electrical arc creates a plasma in one or more gasses located in the first area, wherein the plasma is located in a plasma region. In addition, the fiber holding mechanism selectively positions the portion of the optical fiber in a second area that is adjacent to and outside of the plasma region, wherein debris left on that portion is removed when the plasma is present and the portion of the optical fiber is positioned in the second area.

The present invention also relates to an apparatus for preparing an optical fiber having at least one coating layer that includes stripping module for removing nearly all of the at least one coating layer present at a portion of the optical fiber, a cleaning module, a cleaving module, a cleaving module for cleaving an end of the optical fiber, and a fiber holding mechanism for holding the optical fiber and moving the optical fiber among the stripping module, the cleaning module and the cleaving module. The cleaning module includes a first electrode and a second electrode, wherein a pulsed electrical arc is selectively generated in a first area between the first electrode and the second electrode. The pulsed electrical arc creates a plasma in a plasma region in one or more gasses located in the first area. The fiber holding mechanism selectively positions the portion of the optical fiber at least partially within the plasma region, wherein debris left on that portion is removed when the plasma is present and that portion is positioned at least partially within the plasma region.

An aspect of the present invention also relates to a method for reducing the gap resistance between two electrodes, such as the electrodes used in the cleaning and stripping apparatuses described above, by injecting negative ions into the gas or gasses that are located between the electrodes. As a result, the voltage that is required to cause dielectric breakdown and initiation of the electrical arc is drastically reduced.

The present invention also provides a method of generating an electrical arc that includes steps of providing a first electrode and a second electrode, determining a dielectric strength of a gap region between the first electrode and the second electrode, determining a desired dielectric strength change based on the determined dielectric strength, injecting an amount of ions into the gap region, wherein the amount of ions is controlled based on the desired dielectric strength change, and providing a voltage to the first electrode, the voltage causing the electrical arc to be formed between the first electrode and the second electrode. Preferably, the amount of ions injected into the gap region causes the dielectric strength of the gap region to be changed by an amount substantially equal to the desired dielectric strength change.

In one particular embodiment, the injecting step includes determining a voltage level of an ionizer voltage to be provided to an ionizer device based on the desired dielectric strength change, and providing the ionizer voltage having the voltage level to the ionizer device to cause the ionizer device to inject the ions into the gap region. Preferably, the step of determining the voltage level of the ionizer voltage includes consulting a stored table which matches each of a plurality of stored ionizer voltage levels to a respective stored dielectric strength change and choosing the voltage level of the ionizer voltage from the stored table. In addition, the step of determining the desired dielectric strength change based on the measured dielectric strength preferably includes determining a difference between the measured dielectric strength and a predetermined desired final dielectric strength.

In one particular embodiment, the step of determining the dielectric strength of the gap region includes applying a pre-fuse voltage to the first electrode, wherein when the pre-fuse voltage reaches a pre-fuse arc voltage level the pre-fuse voltage causes a pre-fuse arc to be formed between the first electrode and the second electrode, and using the pre-fuse arc voltage level and a distance between the first electrode and the second electrode to determine the dielectric strength of the gap region.

The method described above may be employed during a process of fusion splicing a first optical fiber to a second optical fiber wherein the method further includes using the heat generated by the arc to melt a portion of the first optical fiber and a portion of the second optical fiber to cause the first optical fiber to be bonded to the second optical fiber. Alternatively, the method may be employed during a process of preparing an optical fiber, wherein the method further includes using the heat generated by the arc to remove coating material, such as debris and/or a coating layer, which is present on a portion of the optical fiber.

Furthermore, the method may be implemented in an apparatus employing an electrician arc, such as, without limitation, a fusion splicer or an apparatus for preparing an optical fiber.

BRIEF DESCRIPTION OF THE DRAWINGS

These and other advantages of the present invention will become readily apparent upon consideration of the following detailed description and attached drawings wherein.

DESCRIPTION OF THE PREFERRED EMBODIMENTS

Figure 1:
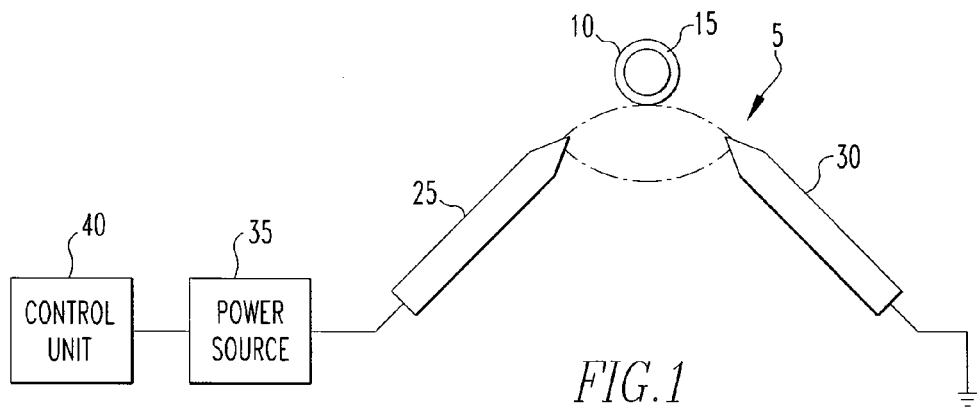
FIGS. 1 and 2 are front and top schematic diagrams, respectively, of a cleaning apparatus according to one embodiment of the present invention that employs an electrical arc for removing debris from an optical fiber.
Figure 2:
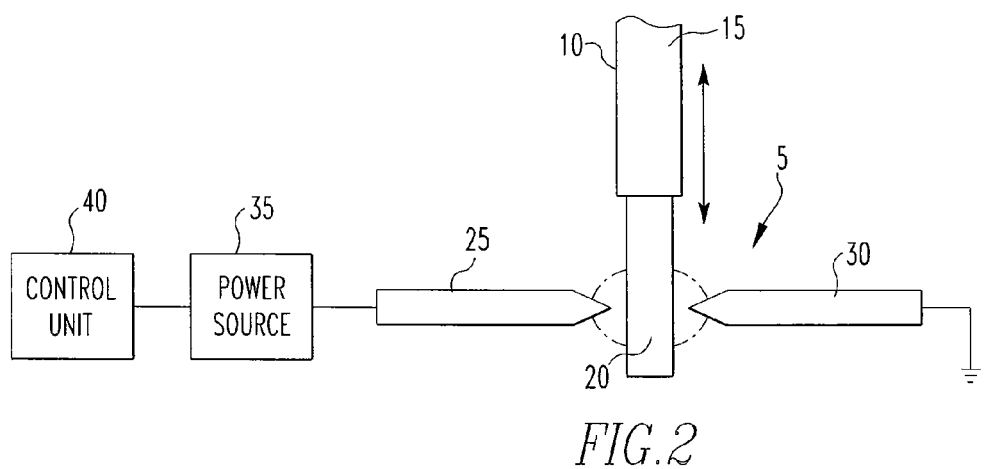

FIGS. 1 and 2 are front and top schematic diagrams, respectively, of a cleaning apparatus 5 according to one embodiment of the present invention that employs an electrical arc for removing debris from an optical fiber 10. While optical fiber 10 is depicted in FIGS. 1 and 2 as a single optical fiber, it should be understood that optical fiber 10 may also consist of multiple optical fibers as in the case of a ribbon fiber. As seen most readily in FIG. 2, optical fiber 10 has been stripped, i.e., a portion of the coating layer 15 has been removed yielding an exposed glass portion 20.

Cleaning apparatus 5 includes a first electrode 25 and a second electrode 30. The first electrode 25 and the second electrode 30 are separated by a fixed distance. The first electrode 25 is electrically connected to a power source 35. The second electrode 30 is connected to ground. The power source 35 is under the control of a control unit 40 that includes a processing unit such as a microprocessor. In addition, as seen in FIG. 2, a motor driven holding mechanism (not shown) is provided to enable the optical fiber 10 to be selectively moved in the direction of the arrows in FIG. 2. Preferably, at least the first electrode 25 and the second electrode 30 are provide within an enclosure (not shown), which may be a partially or fully airtight enclosure.

The power source 35 is adapted to selectively provide a voltage to the first electrode 25 that in turn causes an electrical arc to be generated between the first electrode 25 and the second electrode 30. The electrical arc is created by causing a dielectric breakdown of the air between the first electrode 25 and the second electrode 30. This breakdown occurs when a charge buildup exceeds the electrical limit or dielectric strength of the air between the first electrode 25 and the second electrode 30.

The voltage provided to the first electrode 25 is of such a level that the electrical arc that is generated creates a plasma field between the first electrode 25 and the second electrode 30 by ionizing the air located there between. As indicated by the dashed lines in FIGS. 1 and 2, the region in which the generated plasma field exists is located just below the plane in which the optical fiber 10 is able to move. For convenience, this region will be referred to herein as the plasma region. The voltage required to create a sufficient arc for this purpose is on the order of 10 KV to 30 KV.

In one particular implementation of the embodiment of the cleaning apparatus 5 shown in FIGS. 1 and 2, the exposed glass portion 20 of the optical fiber is positioned above and therefore outside of the plasma region, and a continuous arc is generated between the first electrode 25 and the second electrode 30. The heat that is generated by the plasma field far exceeds the melting temperature of the material making up the coating layer 15. Specifically, the heat is on the order of 300° C. or higher. As a result, rather than melting any coating layer debris, the heat actually causes a non-combustive explosion that removes any coating layer debris, both large and small, that is left on the exposed core portion 20. This occurs because the coefficient of thermal expansion of the coating material relative to the modulus of elasticity of the coating material is such that, when exposed to the heat generated by the plasma field, the coating martial expands at a rate that is faster than it can accommodate without breaking up. In addition, in order for the coating layer debris to be removed without melting or otherwise damaging the glass material making up the exposed glass portion 20, the duration of the electrical arc must be sufficiently short and/or the optical fiber 10, and in particular the exposed core portion 20, must be translated relative to the plasma region at a sufficient rate. Preferably, the duration of the arc is on the order of 50 milliseconds on and 100 milliseconds off, and the rate of translation is on the order of between 0.1 mm/second and 100 mm/second, most preferably 5 mm/second or higher. Thus, in this particular implementation of the invention, the optical fiber 10 is positioned outside of the plasma region and the heat generated by the plasma field is used to remove coating debris. This is in contrast to the prior art in which, as discussed above, optical fibers are placed directly within the plasma field generated by a continuous electrical arc.

According to another particular implementation of the embodiment of the cleaning apparatus 5 shown in FIGS. 1 and 2, the power source 35 is controlled by the control unit 40 such that multiple arcs between the first electrode 25 and the second electrode 30 may be successively generated at a particular frequency. This results in what shall be referred to herein as a pulsed arc between the first electrode 25 and the second electrode 30. In addition, in the preferred implementation, as the pulsed arc is generated, the optical fiber 10, and in particular the exposed glass portion 20, is positioned above the plasma region and is translated in one or both of the directions indicated by the arrows in FIG. 2. As the optical fiber 10 is translated, the heat generated by the plasma field removes the coating layer debris, both large and small, that is left on the exposed core portion 20 in the manner described above (i.e., as a result of a non-combustive explosion), thereby cleaning the optical fiber 10.

In the preferred embodiment, the pulsed arc is generated at a frequency of about 15 KHz at a 50% duty cycle, although is should be appreciated that other frequencies and duty cycles may also be used without departing from the scope of the invention. The arc power that is required for effective cleaning will vary for each application, and will depend on the type and quantity of optical fibers being cleaned simultaneously. In addition, the required power level is dictated, to a smaller degree, by the environmental conditions under which the cleaning process is being performed (e.g., higher altitudes will require greater power). Finally, the required power level will be dictated by the rate at which the optical fiber 10 is translated. In the preferred embodiment, the correlation between power level and rate of translation is tested and adjustments are made automatically by the control unit 40. The arc power should thus be selectively controlled by an operator though the control unit 40, which, as described above, controls the operation of the power source 35. In particular, the arc power level may be controlled by turning the pulsed arc on and off at an adjustable ratio separate from the primary duty cycle. In other words, the pulsed arc is turned on, for example at 15 KHz with a 50% duty cycle, for a first time period, such as 50 ms, and then off for a second time period, such as 150 ms, and so on. Preferably, the arc pulsing is repeated until the entirety of the exposed core portion 20 is translated above the plasma field in one or both directions. In one particular embodiment, the pulsed arc is a 15 KHz 50% duty cycle arc with an on time of 50 ms and an off time of 150 ms for one optical fiber, 121 ms for four optical fibers, 88 ms for eight optical fibers, and 50 ms for twelve optical fibers. A user interface may be provided on the control unit 40 to enable an operator to easily make the appropriate adjustments.

Figure 3:
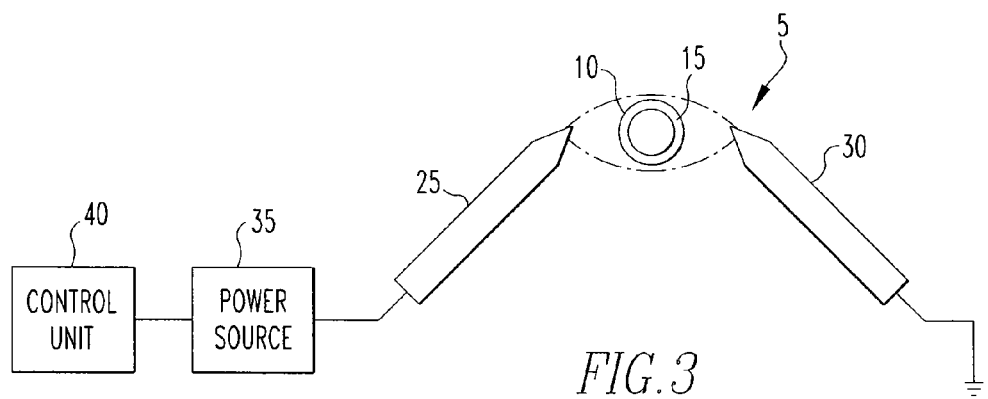
FIG. 3 is a front schematic diagram of a cleaning apparatus that employs a pulsed electrical arc for removing debris from an optical fiber according to an alternative embodiment of the present invention.

Referring to FIG. 3, a front schematic diagram is provided of a cleaning apparatus 5 that employs a pulsed electrical arc for removing debris from an optical fiber 10 according to an alternative embodiment of the present invention. The apparatus and method according to this embodiment differ from the embodiment shown in FIGS. 1 and 2 in that in this embodiment, the optical fiber 10 is translated at least partially, and preferably entirely, within the plasma field that is generated by the pulsed arc between the first electrode 25 and the second electrode 30.

Figure 4:
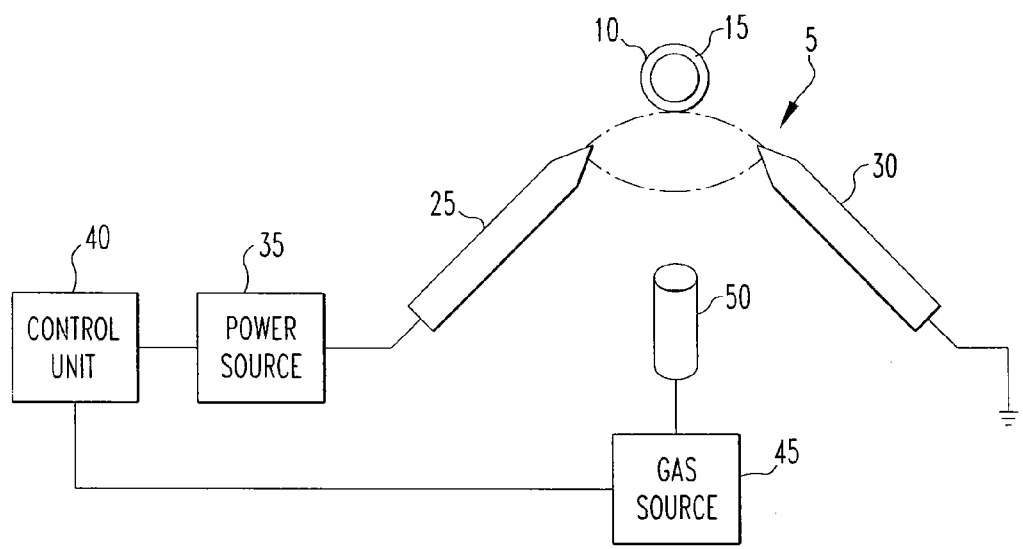
FIGS. 4 and 5 are schematic diagrams of a cleaning apparatus that employs either a continuous electrical arc or a pulsed electrical arc for removing debris from an optical fiber according to further alternative embodiments of the present invention, wherein the electrical arc creates a plasma in a gas introduced from a gas source.
Figure 5:
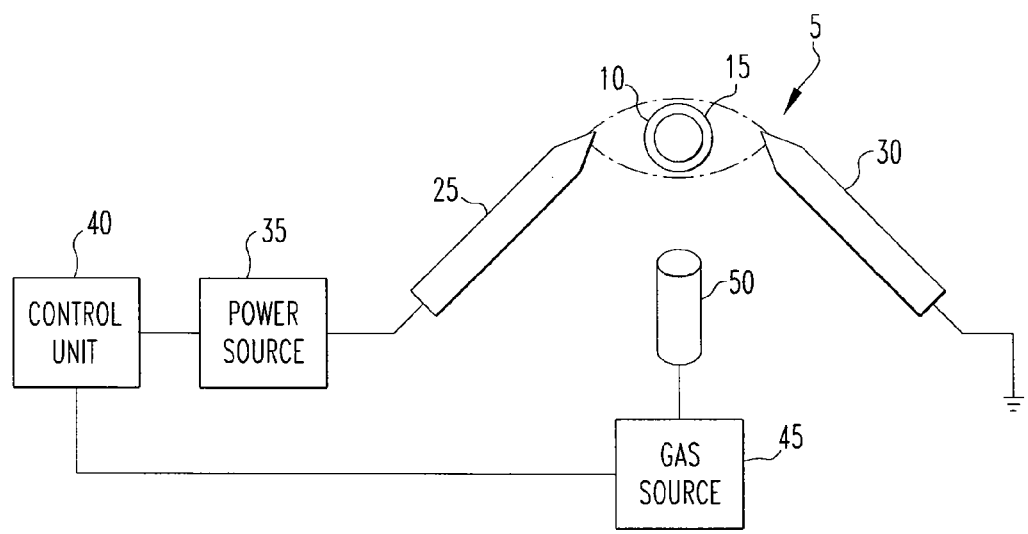

FIGS. 4 and 5 are schematic diagrams of a cleaning apparatus 5 that employs either a continuous electrical arc or a pulsed electrical arc, both as described in connection with FIGS. 1 and 2, for removing debris from an optical fiber 10 according to further alternative embodiments of the present invention. In the embodiments shown in FIGS. 4 and 5, the cleaning apparatus 5 is further provided with a gas source 45 that stores a gas, such as $CO_2$ or an inert gas like nitrogen or argon. Under the control of the control unit 40, the gas source 45 selectively supplies the stored gas to the region between the between the first electrode 25 and the second electrode 30 through nozzle 50. As a result, when the continuous or pulse arc is generated between the first electrode 25 and the second electrode 30, the plasma field will be generated within the supplied gas. $CO_2$ is a preferred gas because it removes both oxygen and humidity from the region where the cleaning occurs, which in some cases may adversely effect the cleaning. Any other gas or combination of gasses that does the same thing may also be used. In addition, a gas or combination of gasses that reduces the dielectric strength in the area between the first electrode 25 and the second electrode 30 may also be used. As described in greater detail elsewhere herein, reducing the dielectric strength in the area between the first electrode 25 and the second electrode 30 reduces the magnitude of the voltage that must be supplied by the power source 35 to generate the electrical arc.

The embodiment of FIG. 4 is similar to the embodiment of FIG. 1 in that the optical fiber 10 is positioned and translated just above the plasma region, and the embodiment of FIG. 5 is similar to the embodiment of FIG. 3 in that the optical fiber 10 is translated at least partially, and preferably entirely, within the plasma region. In the embodiments shown in FIGS. 4 and 5, the enclosure (not shown) that houses at least the first electrode 25 and the second electrode 30 is preferably an airtight enclosure that is operatively coupled to a vacuum pump for selectively evacuating the interior thereof before the introduction of the gas from the gas source 45.

Figure 6:
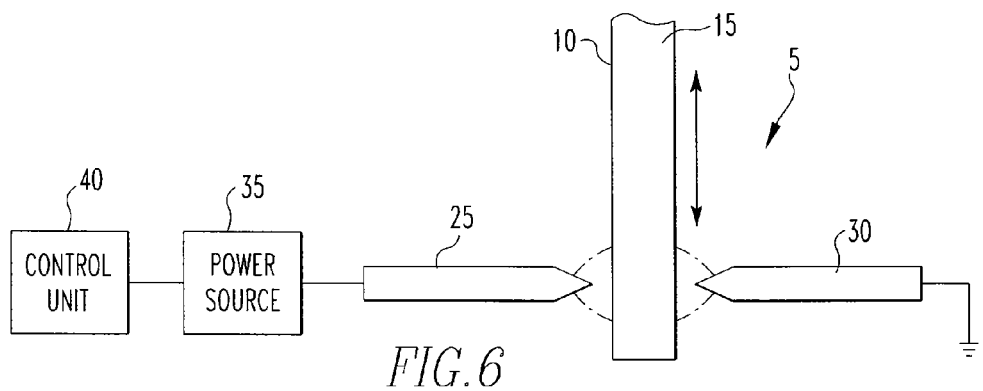
FIG. 6 is a top schematic diagram of a stripping apparatus according to an alternative embodiment of the present invention that employs an electrical arc for stripping an optical fiber.

As seen in FIG. 6, the various apparatus and methods described herein may also be used to remove a portion of the coating layer 15 of the optical fiber 10 (i.e., to strip the optical fiber 10). In this case, the portion of the coating layer to be removed is either translated above (FIGS. 1, 2 and 4) or at least partially within (FIGS. 3 and 5) the plasma region generated between the first electrode 25 and the second electrode 30 by either the continuous arc or the pulsed arc, as the case may be.

Figure 7:
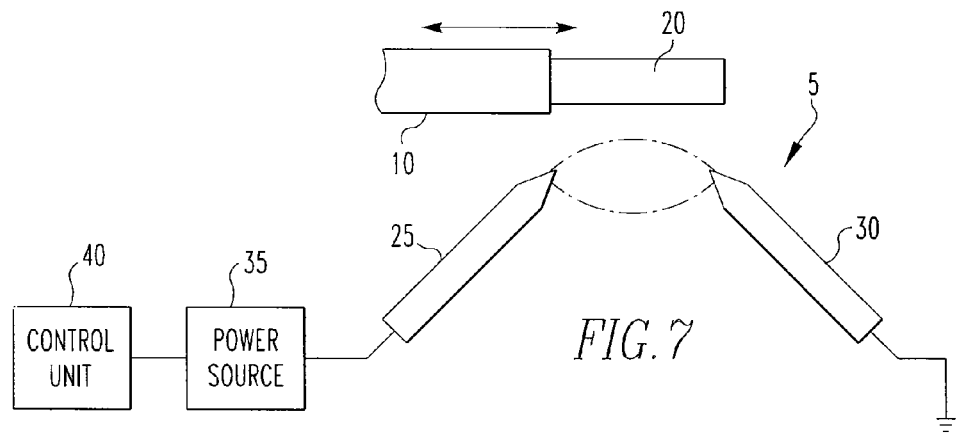
FIG. 7 is a front schematic view of an alternative embodiment of the cleaning apparatus according to the present invention in which the optical fiber is movable in a direction that is generally parallel to the axis along which the arc is generated.

In FIGS. 1 through 6, the optical fiber 10 is shown as being moveable in a direction that is generally perpendicular to the axis along which the arc is generated between the first electrode 25 and the second electrode 30. FIG. 7 is a front schematic view of an alternate embodiment of the cleaning apparatus 5 in which the optical fiber 10 is moveable in a direction, shown by the arrows in FIG. 7, that is generally parallel to the axis along which the arc is generated between the first electrode 25 and the second electrode 30. All other aspects of the cleaning apparatus 5 may be as described above. For example, although not shown in FIG. 7, it will be appreciated that a gas source 45 may be provided as shown in FIG. 4 so that the plasma field can be generated from the gas provide thereby.

Figure 8:
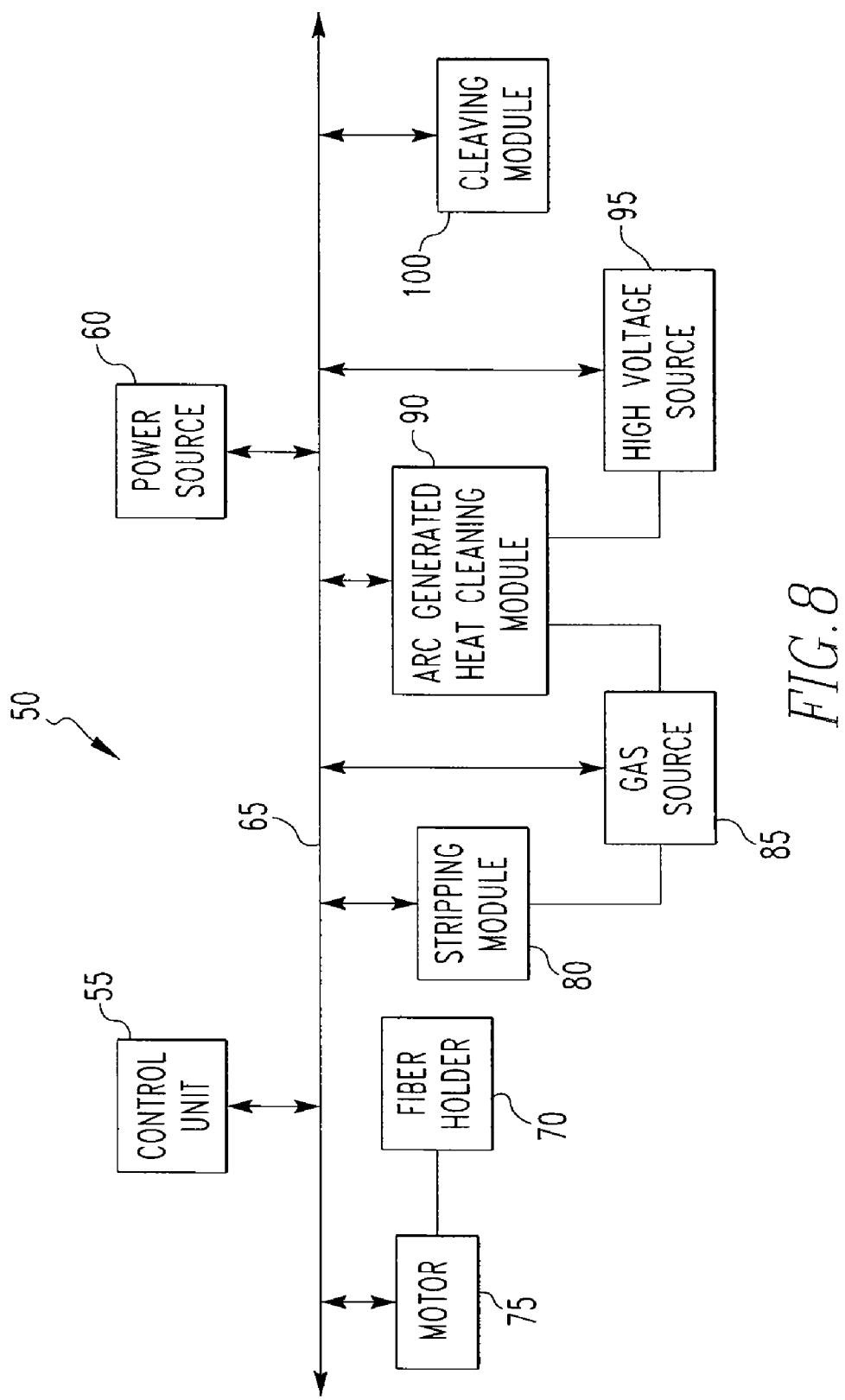
FIG. 8 is a block diagram of an optical fiber prep unit according to a further aspect of the present invention.

FIG. 8 is a block diagram of an optical fiber prep unit 50 according to a further aspect of the present invention. The prep unit 50 includes a control unit 55 and a power source 60 that are similar to the control 40 and power source 35, respectively, that are shown in FIG. 1 through 7. The control unit 55 and power source 60 are operatively connected to one or more busses, represented by bus 65. The prep unit 50 also includes a fiber holder 70 for holding an optical fiber while it is processed by the prep unit 50. The fiber holder 70 is connected to electric motor 75, which in turn is operatively connected to bus 65. The motor 75 enables the fiber holder 70, and thus the fiber being processed, to be selectively moved within the prep unit 50 as described herein.

The prep unit 50 includes three modules that enable it to strip, clean and cleave an optical fiber prior to being spliced (by a separate device such as a fusion splicer). First, a stripping module 80 is provided for stripping the optical fiber. The stripping module 80 may employ any known or hereafter developed stripping methods. In one embodiment, the stripping module 80 is a mechanical stripping module having a matching pair of flat blades and a fiber heating surface for preheating the optical fiber prior to being stripped by the blades. In another embodiment, the stripping module 80 may be an electrical arc based stripping module as shown and described in connection with FIG. 6. In the latter case, the prep unit 50 may include a gas source 85, similar to gas source 45 shown in FIGS. 4 and 5, for introducing a gas, such as $CO_2$ or an inert gas like nitrogen or argon, into the stripping module 80 from which the plasma used for stripping is generated. As seen in FIG. 8, both the stripping module 80 and the gas source 85 are operatively connected to the bus 65 in order to receive control signals from the control unit 55 and/or power from the power source 60.

The prep unit 50 is further provided with an arc generated heat cleaning module 90 for cleaning the optical fiber after it has been stripped by stripping module 80. The arc generated heat cleaning module 90 uses a plasma generated by an electrical arc to clean the optical fiber, and may be implemented in accordance with any of the various embodiments described herein in connection with FIGS. 1, 2, 3, 4, 5 and 7. A high voltage source 95, operatively coupled to the power source 60 through the bus 65, is connected to arc generated heat cleaning module 90 for providing the high voltages necessary to create the continuous or pulsed electrical arc. In addition, as will be appreciated, gas source 85 is connected to arc generated heat cleaning module 90 for embodiments in which a gas such as $CO_2$ or an inert gas like nitrogen or argon is used in the generation of the plasma.

Finally, prep unit 50 includes a cleaving module 100 for cleaving the stripped and cleaned end of the optical fiber. The cleaving module 100 may employ any known or hereafter developed cleaving methods. For example, the cleaving module 100 may include a straight diamond edge for ultrasonically cleaving the optical fiber. This solution, which results in a low cleave angle, is particularly well adapted for use in connection with single fibers, but is not well suited for ribbon fibers. Alternatively, the cleaving module 100 may use a carbide blade to scribe the optical fiber and a plunger mechanism to break the fiber at the scribe point and create a flat cleave. This solution may be used with both single fibers and ribbon fibers.

In operation, an optical fiber that is to be spliced is placed on fiber holder 70. The fiber holder 70 is then moved by motor 75 to the stripping module 80 where an appropriate amount of protective coating layer is removed. Next, the fiber holder 70 is moved by the motor 75 to the arc generated heat cleaning module 90 wherein the debris remaining after the cleaning step is removed using electrical arc based cleaning as described herein. Finally, the fiber holder 70 is moved by motor 75 to the cleaving module 100 wherein the optical fiber that is to be spliced is cleaved so that it may subsequently be spliced with another fiber.

As described above, the various embodiments of the present invention utilize an electrical arc generated between two electrodes (the first electrode 25 and the second electrode 30) separated by a certain fixed distance to create a plasma in a gas or mixture of gasses located between the electrodes. The electrical arc is created by applying a voltage to one of the electrodes (the first electrode 25) that is sufficient to cause a dielectric breakdown of the gas or mixture of gasses present between the two electrodes. This breakdown occurs when a charge buildup exceeds the electrical limit or dielectric strength of the air between the electrodes. Thus, the magnitude of the voltage that is required to cause the dielectric breakdown and thus generate the electrical arc is a function of the dielectric strength of the gas or mixture of gases present between the two electrodes. The higher the dielectric strength, and thus the higher the gap resistance between the two electrodes, the larger the voltage that is required to generate the electrical arc.

As described in the Background, in many applications that require an arc, the voltage potential between the electrodes is simply increased until a spark occurs. Once a spark occurs, the gas or gasses, such as air, between the electrodes becomes ionized. Since ionized gasses, such as air, are conductors rather than insulators, the arc, resulting from the spark, can then be maintained easily by current regulation. Because of the fact that the gas or gasses, such as air, typically have a huge resistance to current flow until dielectric breakdown and effectively a negative resistance afterwards, highly complex and costly circuits are required to compensate and prevent system meltdown resulting from the relatively high applied voltages. In addition, in some applications, there may be a practical limit to the magnitude of voltage that can be applied to the electrode. Similarly, in many applications, it is advantageous to limit the magnitude of voltage that is required to generate an electrical arc so that smaller, less complex and less expensive electrical components may be used. Finally, a number of other factors also somewhat affect the dielectric strength of a fixed length gap between two electrodes, including humidity, pressure/altitude, gasses present, natural radioactivity, cosmic rays, and electrode condition. To the extent that any of these factors increase dielectric strength and gap resistance, a larger voltage will be required to generate an electrical arc between the two electrodes.

Thus, an aspect of the present invention provides a method by which the gap resistance between two electrodes separated by a fixed distance can be reduced, thereby reducing the magnitude of the voltage that is required to generate an electrical arc between the two electrodes. In particular, the present invention reduces the gap resistance between two electrodes by injecting negative ions into the gas or gasses that are located between the electrodes. As a result, the voltage that is required to cause dielectric breakdown and initiation of the electrical arc is drastically reduced. This minimizes the impact of uncontrolled variables (listed above) while simultaneously decreasing the magnitude of the current avalanche caused when dielectric breakdown occurs.

Figure 9:
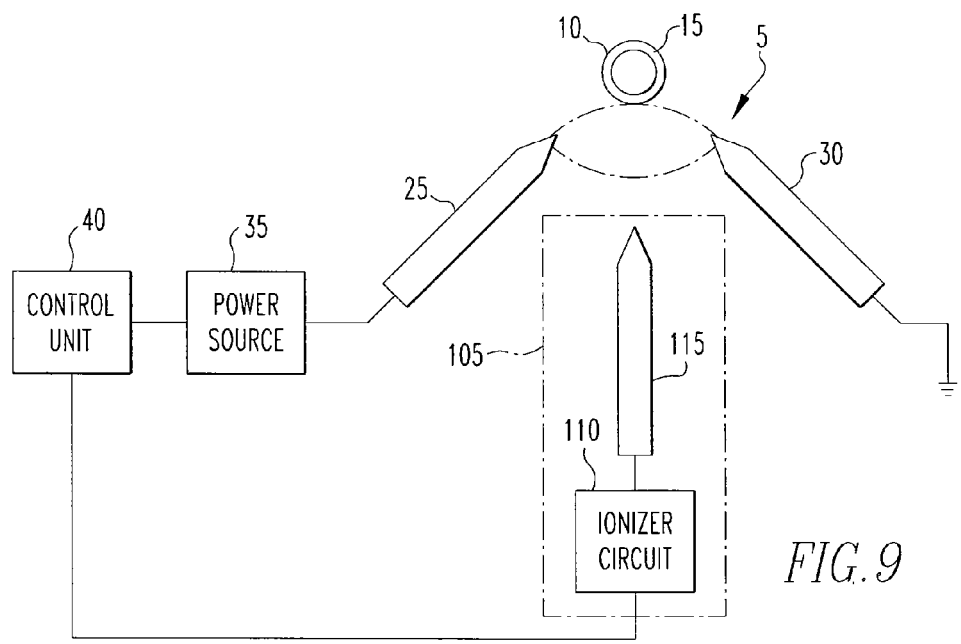
FIG. 9 is a schematic diagram of a cleaning apparatus that employs a method for reducing the dielectric strength and thus the gap resistance in the area between the first electrode and the second electrode according to yet a further aspect of the present invention.

FIG. 9 is a schematic diagram of a cleaning apparatus 5 that employs either a continuous electrical arc or a pulsed electrical arc, both as described in connection with FIGS. 1 and 2, for removing debris from an optical fiber 10 according to a further alternative embodiment of the present invention. The embodiment of cleaning apparatus 5 shown in FIG. 9 employs the method described above for reducing the dielectric strength and thus the gap resistance in the area between the first electrode 25 and the second electrode 30.

The cleaning apparatus 5 shown in FIG. 9 is further provided with an ionizer device 105 in close proximity to the first electrode 25 and the second electrode 30. Under the control of the control unit 40, the ionizer device 105 injects negative ions into the region between the first electrode 25 and the second electrode 30, and thus into the gas, which in this particular case is air, that is located in that region. In the embodiment shown in FIG. 9, the ionizer device 105 is a standard negative ionizer circuit 110 electrically coupled to an associated electrode 115, such as those that are employed in well known air cleaning devices. In such a case, when the ionizer circuit 110 is turned on, the associated electrode 115 emanates negative ions into the air. As will be appreciated, other known ionizer device configurations may also be employed. The presence of these additional ions between the first electrode 25 and the second electrode 30 greatly reduces the dielectric strength of the gas, and therefore the gap resistance between the first electrode 25 and the second electrode 30. Since ionized air is a good conductor of electricity, an electrical arc can easily be created in this medium without significant consideration of the variables mentioned above and with significantly reduced voltages. In combination, these advantages lead to a more stable and controllable arc with simpler and more cost effective circuitry. It is important to note that the ionizer electrode should not be positioned too close to the first electrode 25 and the second electrode 30 as an electrical discharge between them is not desirable.

As will be appreciated, the ionizer device 105, and thus the method described above, may be used in connection with any of the various embodiments described herein (FIGS. 3 through 7) to reduce the voltage that must be provided by power source 35 to generate an electrical arc. In the embodiments that utilize a gas source 45 (FIGS. 4 and 5), the negative ions are injected into the gas or gasses that are introduced by the gas source 45.

As will be also appreciated, the method of reducing dielectric strength and gap resistance is not limited to use with the cleaning apparatus and stripping apparatus embodiments described herein. Instead, it may be used in any application that requires the generation of an electrical arc between two electrodes. For example, in the arena of fusion splicing, an electrical arc is utilized to generate sufficient heat to melt and subsequently bond together two silica glass optical fibers. An ionizer device, such as ionizer deice 105, may be provided in such an application to inject negative ions into the region between the arc generating electrodes such that the voltage that is required to generate the arc used in the fusion splicing process may be reduced. Other potential applications will be apparent to those of skill in the art, such as, without limitation, in the arc welding and arc lighting fields.

In many applications, it is advantageous to be able to selectively control the location and orientation of, i.e., move, a plasma field that is generated by an electrical arc between two electrodes. For example, in the case of fusion splicing of optical fibers using a plasma, the ability to anneal the splice point where the fiber ends have been fused together by sweeping the plasma field (e.g., in a left to right fashion) is advantageous as it improves the quality of the splice. According to a further aspect of the present invention, an ionizer device, such as ionizer device 105, may be used to control and selectively move and adjust a plasma field generated between two electrodes. In particular, because an ionizer device as described herein emits negative ions, it behaves in a manner similar to a magnet and is able to pull the plasma field toward it. In the case of the ionizer device 105, the electrode 115 emits the negative ions and therefore has a negative potential. By adjusting the power output (which controls the number of negative ions emitted), the location, and/or the orientation (relative to the arc path; i.e., the degree to which it points in the direction of the arc path) of the ionizer electrode 115, the plasma field generated as a result of the arc can be selectively moved and repositioned (i.e., steered) relative to its original path. This feature can be valuable because it gives a new dimension of control to the arc and resulting plasma field that is currently unavailable in the industry.

As described elsewhere herein, in prior art devices that require an arc to be generated between two electrodes, such as fusion splicing devices and fiber stripping and/or cleaning devices, the common practice is to simply increase the voltage potential between the electrodes until dielectric breakdown, and as a result an arc, occurs between the electrodes. Once dielectric breakdown occurs, the air between the electrodes becomes ionized, and since ionized air is an electrical conductor rather than an insulator, the arc can then be maintained by current regulation at reduced voltages. The problem is that the voltage that is required to initiate the dielectric breakdown/arc, referred to as the trigger voltage, is dependent on the dielectric strength in the region between the electrodes. In many cases that dielectric strength is high (meaning that the region between the electrodes is not a good electrical conductor), and as a result a relatively high trigger voltage is often required to initiate the arc. However, once the dielectric breakdown has occurred (as a result of the trigger voltage), a much smaller voltage is required to maintain the arc between the electrodes because the region between the electrodes immediately becomes a very good electrical conductor. This process creates a thermal profile for the arc (and the plasma generated thereby between the electrodes) that includes a large, semi-random thermal spike at the point of arc initiation (with the actual level of the spike being determined by the required trigger voltage) and relatively fast current control is required to bring the voltage applied to the electrodes down to the level that is used to maintain the arc. However, no matter how quickly the voltage is able to be reduced (through current control circuitry), the large thermal spike still occurs. This large thermal spike and large change between the trigger voltage and the maintenance voltage has the potential to adversely affect the stability of the arc that is generated between the electrodes.

Furthermore, as noted elsewhere herein, a number of factors can effect (e.g., increase) the dielectric strength between the electrodes and therefore effect (e.g., increase) the required trigger voltage. As will be appreciated, this may exacerbate the problem described above by increasing the level of the thermal spike and the difference between the trigger voltage and the maintenance voltage. Those factors include, for example, humidity, pressure/altitude, gasses present, natural radioactivity, cosmic rays, and electrode condition. All of these factors change the dielectric strength by adding or removing free electrons/ions to the space between the electrodes and thereby altering the electrical resistance of the gap.

Figure 10:
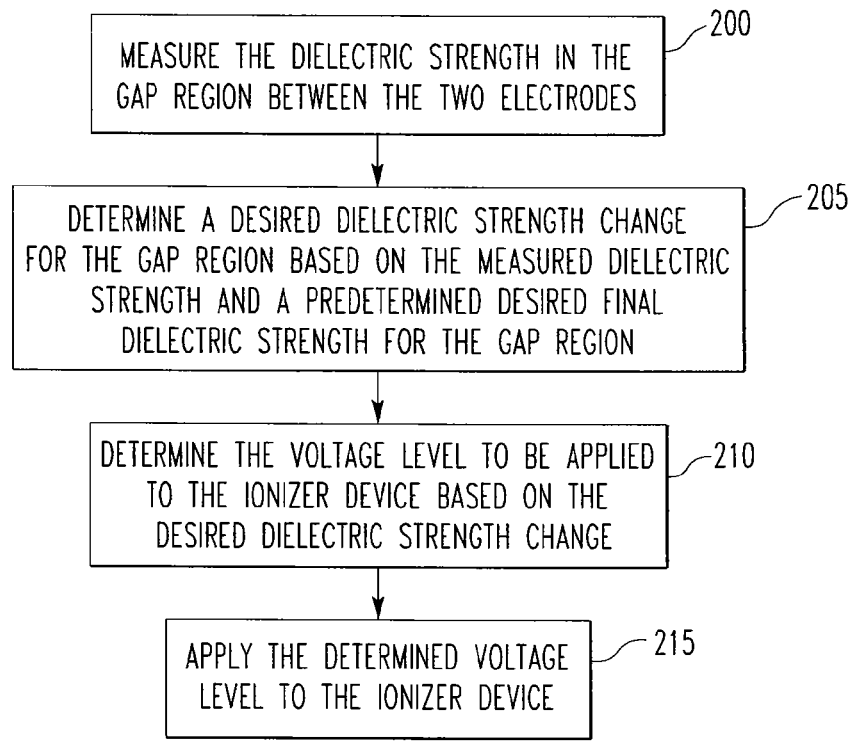
FIG. 10 is a flowchart showing a method of controlling the dielectric strength in the region between two electrodes according to an embodiment of the present invention.
Figure 11:
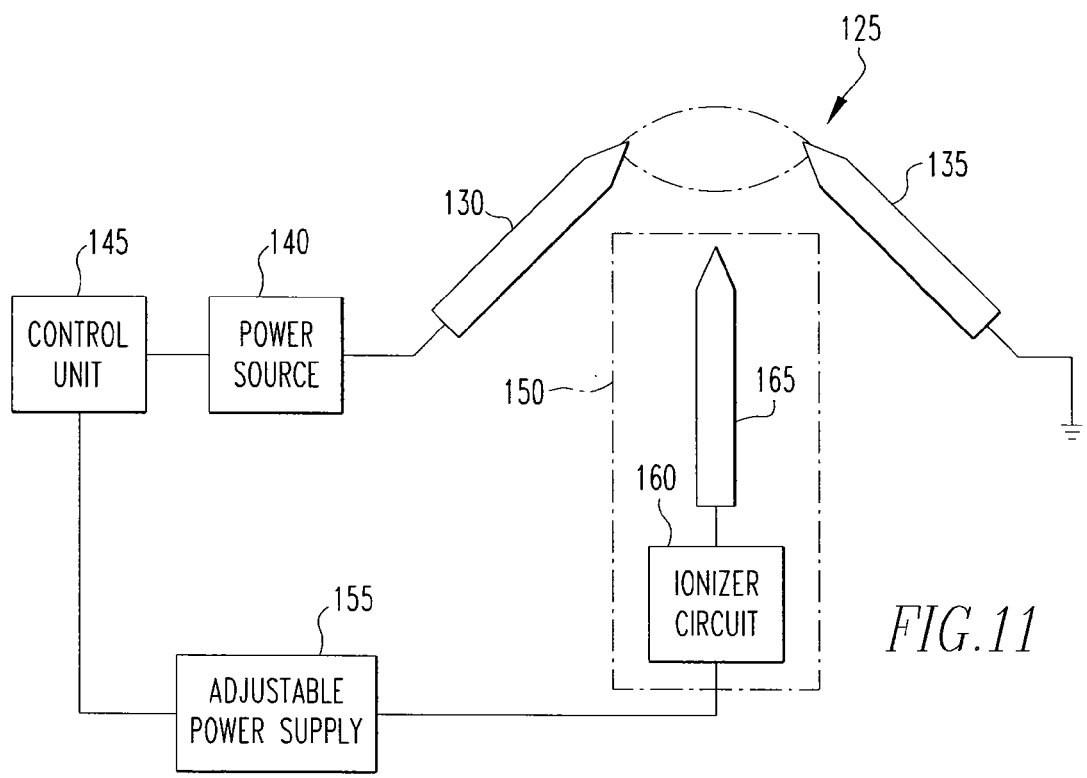
FIG. 11 is a schematic diagram of a device that requires an arc to be generated between two electrodes in which the method shown in FIG. 10 may be implemented.

FIG. 10 is a flowchart showing a method of controlling the dielectric strength in the region between two electrodes according to an embodiment of the present invention which minimizes the problems described above. FIG. 11 is a schematic diagram of a device 125 that requires an arc to be generated between two electrodes in which the method shown in FIG. 10 may be implemented. The device 125 may be, for example and without limitation, a fusion splicing device or a fiber stripping and/or cleaning device. As seen in FIG. 11, the device 125 includes a first electrode 130 and a second electrode 135. The first electrode 130 and the second electrode 135 are separated by a fixed distance. The first electrode 130 is electrically connected to a power source 140 and the second electrode 135 is connected to ground. The power source 140 is under the control of a control unit 145 that includes a processing unit such as a microprocessor, a microcontroller or another suitable processor. The control unit 145 also includes a memory (which may be internal or external to the processing unit) that stores a number of software routines executable by the processing unit for performing the functions described herein. The power source 140 is adapted to selectively provide a voltage to the first electrode 130 that in turn causes an electrical arc to be generated between the first electrode 130 and the second electrode 135. As described above, the electrical arc is created by causing a dielectric breakdown of the air between the first electrode 130 and the second electrode 135.

The device 125 is also provided with an ionizer device 150, which is similar to the ionizer device 105 shown in FIG. 9, in close proximity to the first electrode 130 and the second electrode 135. The ionizer device 150 is operatively coupled to an adjustable power supply 155. The adjustable power supply 155 is in turn operatively coupled to and under the control of the control unit 145. As a result, and as explained in more detail below, the adjustable power supply 155 is adapted to provide a selectively adjustable voltage to the ionizer device 150 as determined by the control unit 145. Under the control of the control unit 145 and the adjustable power supply 155, the ionizer device 150 injects ions (which may be positive or negative depending on the polarity of the system) into the region between the first electrode 130 and the second electrode 135, and thus into the gas, e.g., air, that is located in that region. The number/amount of ions that is injected is dependent upon the particular voltage level that is supplied to the ionizer device 150 by the adjustable power supply 155 (the higher the voltage, the greater the number of ions) and is therefore controlled by the control unit 145. As described in connection with FIG. 9, the ionizer device 150 may be a standard ionizer circuit 160 electrically coupled to an associated electrode 165, such as those that are employed in well known air cleaning devices, in which case the electrode 165 emanates ions into the air when a voltage is applied to the ionizer device 150. Other known ionizer device configurations may also be employed. As described elsewhere herein, the presence of these additional ions between the first electrode 130 and the second electrode 135 reduces the dielectric strength of the gas (e.g. air) in the region between the first electrode 130 and the second electrode 135 (as described elsewhere herein, this also means that the gap resistance between the first electrode 130 and the second electrode 135 is reduced). The extent to which the dielectric strength is reduced depends on the amount of ions that are injected, and thus on the level of the voltage that is supplied to the ionizer device 150.

Referring to FIG. 10, the method shown therein will now be described. For illustrative purposes, in describing the method, reference is made to the device 125 shown in FIG. 11. It should be appreciated, however, that the method is not limited to implementation in the device 125, and instead may be implemented in other devices that require an arc to be generated between two electrodes. The method begins at step 200, wherein the dielectric strength of the gap region between the first electrode 130 and the second electrode 135 is measured. This may be done in any of a number of suitable manners that are now known or hereafter developed. For example, in the case where the device 125 is a fusion splicer, the dielectric strength of the gap region between the first electrode 130 and the second electrode 135 may be measured based upon a pre-fuse arcing step. In particular, as is known in the art, when two optical fibers are being fusion spliced together it is common to perform a pre-fuse arcing step wherein, before the fibers are positioned for splicing, an arc of relatively short duration is generated between the two electrodes (e.g., the first electrode 130 and the second electrode 135) by applying a voltage to one of the electrodes. The pre-fuse arc is beneficial in that is removes debris that may be present on the electrodes and/or the fibers to be spliced. The dielectric strength of the gap region between the first electrode 130 and the second electrode 135 may be measured by measuring the voltage that is required to generate the pre-fuse arc. Once that voltage is known, it can be used to calculate (in the control unit 145) the dielectric strength based on the known fixed distance between the first electrode 130 and the second electrode 135 using methods/equations known in the art. Next, at step 205, a desired change in the dielectric strength of the gap region between the first electrode 130 and the second electrode 135 is determined based upon the dielectric strength measured in step 200 and a pre-determined desired final dielectric strength for the gap region between the first electrode 130 and the second electrode 135 (i.e., the dielectric strength that is desired for the gap region between the first electrode 130 and the second electrode 135 prior to the initiation of the arc therebetween).

Next, at step 210, the control unit 145 determines a voltage level that is to be applied to the ionizer device 150 by the adjustable power supply 155 for causing the dielectric strength change determined in step 205 to occur. As described elsewhere herein, the dielectric strength of the gap region between the first electrode 130 and the second electrode 135 will be caused to change as a result of the injection of ions into the gap region by the ionizer device 150, and the amount of ions that are injected will be controlled by the applied voltage level. Preferably, the particular voltage level is determined by the control unit 145 by consulting a look-up table stored thereby that matches each of a plurality of voltage levels to a corresponding dielectric change that will result from the voltage level. The look-up table is preferably generated empirically based data gathered through experiments performed using the device 125 wherein various voltages are applied to the ionizer device 150 and the resulting dielectric change is recorded.

Finally, at step 215, the control unit 145 sends a signal to the adjustable power supply 155 that adjusts the adjustable power supply 155 to cause it to supply the voltage level determined in step 210 to the ionizer device 150. In response, the ionizer device 150 will be caused to inject a certain controlled amount of ions into the gap region, which in turn will cause the dielectric strength in the gap region between the first electrode 130 and the second electrode 135 to be reduced by an amount substantially equal to the desired dielectric strength change determined in step 205. As a result of the change (reduction) in dielectric strength in the gap region between the first electrode 130 and the second electrode 135, the trigger voltage that will thereafter be required to initiate an arc in between the first electrode 130 and the second electrode 135 will be reduced, and, therefore, the thermal spike and difference between trigger and maintenance voltages described elsewhere herein will be reduced. Such reductions are advantageous as they will result in a more stable and controllable arc. As an example, if the device 125 was a fusion splicer that was taken to a new elevation or had contaminated electrodes (which factors would tend to increase the dielectric strength between the electrodes), the exact dielectric could be determined by sensing the trigger voltage required to fire the pre-fuse arc as described above. The dielectric could then be adjusted by adding or reducing the number of ions present, thereby producing exactly the same primary fusion arc as previous splices, regardless of environmental variables or electrode condition. The splicer could basically compensate for huge environmental variations from splice to splice with just the information collected during the pre-fuse arc.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the claims that ultimately issue.

What is claimed is:

1. A method of generating an electrical arc, comprising:
providing a first electrode and a second electrode;
determining a dielectric strength of a gap region between said first electrode and said second electrode;
determining a desired dielectric strength change based on said determined dielectric strength;
injecting an amount of ions into said gap region, wherein said amount of ions is controlled based on said desired dielectric strength change; and
providing a voltage to said first electrode, said voltage causing said electrical arc to be formed between said first electrode and said second electrode.

2. The method according to claim 1, wherein said amount of ions injected into said gap region causes said dielectric strength of said gap region to be changed by an amount substantially equal to said desired dielectric strength change.

3. The method according to claim 1, wherein said injecting step includes determining a voltage level of an ionizer voltage to be provided to an ionizer device based on said desired dielectric strength change, and providing said ionizer voltage having said voltage level to said ionizer device to cause said ionizer device to inject said ions into said gap region.

4. The method according to claim 3, wherein said step of determining the voltage level of the ionizer voltage includes consulting a stored table which matches each of a plurality of stored ionizer voltage levels to a respective stored dielectric strength change and choosing said voltage level of said ionizer voltage from said stored table.

5. The method according to claim 1, wherein said controlling step is performed prior to said step of providing said voltage to said first electrode.

6. The method according to claim 1, wherein said step of determining the desired dielectric strength change based on said measured dielectric strength includes determining a difference between said measured dielectric strength and a predetermined desired final dielectric strength.

7. The method according to claim 1, wherein said step of determining the dielectric strength of the gap region includes applying a pre-fuse voltage to said first electrode, wherein when said pre-fuse voltage reaches a pre-fuse arc voltage level said pre-fuse voltage causes a pre-fuse arc to be formed between said first electrode and said second electrode, and using said pre-fuse arc voltage level and a distance between said first electrode and said second electrode to determine said dielectric strength of said gap region.

8. A method according to claim 1, wherein said method is employed during a process of fusion splicing a first optical fiber to a second optical fiber and wherein said electrical arc generates heat, the method further comprising using said heat to melt a portion of said first optical fiber and a portion of said second optical fiber to cause said first optical fiber to be bonded to said second optical fiber.

9. A method according to claim 1, wherein said method is employed during a process of preparing an optical fiber and wherein said electrical arc generates heat, the method further comprising using said heat to remove coating material that is present on a portion of said optical fiber.

10. The method according to claim 9, wherein said optical fiber includes at least one coating layer, wherein said preparing comprises cleaning said optical fiber, wherein said portion of said optical fiber is a stripped portion of said optical fiber formed by removing nearly all of said at least one coating layer from said portion of said optical fiber, and wherein said coating material comprises debris left on said stripped portion of said optical fiber after said nearly all of said at least one coating layer is removed from said portion of said optical fiber.

11. The method according to claim 9, wherein said optical fiber includes at least one coating layer, wherein said preparing comprises stripping said optical fiber, and wherein said coating material that is present on said portion of said optical fiber that is removed comprises nearly all of said at least one coating layer that is present at said portion of said optical fiber.

12. An apparatus employing an electrical arc, comprising:
a first electrode and a second electrode;
an ionizer device for injecting ions into a gap region between said first electrode and said second electrode;
a voltage source for providing a voltage to said first electrode; and
a control unit having a processing unit and a memory, said memory storing one or more routines executable by said processing unit, said one or more routines including instructions for:
determining a dielectric strength of a gap region between said first electrode and said second electrode;
determining a desired dielectric strength change based on said determined dielectric strength;
causing an amount of ions to be injected into said gap region, wherein said amount of ions is controlled based on said desired dielectric strength change; and
causing said voltage source to provide a voltage to said first electrode, said voltage causing said electrical arc to be formed between said first electrode and said second electrode.

13. The apparatus according to claim 12, wherein said amount of ions injected into said gap region causes said dielectric strength of said gap region to be changed by an amount substantially equal to said desired dielectric strength change.

14. The apparatus according to claim 12, further comprising an adjustable power supply operatively coupled to said control unit and said ionizer device, wherein said instructions for causing the amount of ions to be injected include instructions for determining a voltage level of an ionizer voltage to be provided to said ionizer device based on said desired dielectric strength change, and causing said adjustable power supply to provide said ionizer voltage having said voltage level to said ionizer device to cause said ionizer device to inject said ions into said gap region.

15. The apparatus according to claim 14, wherein said memory stores a table which matches each of a plurality of stored ionizer voltage levels to a respective stored dielectric strength change, and wherein said instructions for determining the voltage level of the ionizer voltage include instructions for consulting and choosing said voltage level of said ionizer voltage from said table.

16. The apparatus according to claim 12, wherein said instructions for determining the desired dielectric strength change based on said measured dielectric strength include instructions for determining a difference between said measured dielectric strength and a predetermined desired final dielectric strength.

17. The apparatus according to claim 12, wherein said instructions for determining the dielectric strength of the gap region include instructions for: (i) causing said voltage source to apply a pre-fuse voltage to said first electrode, wherein when said pre-fuse voltage reaches a pre-fuse arc voltage level said pre-fuse voltage causes a pre-fuse arc to be formed between said first electrode and said second electrode, and (ii) using said pre-fuse arc voltage level and a distance between said first electrode and said second electrode to determine said dielectric strength of said gap region.

18. The apparatus according to claim 12, wherein said apparatus is an apparatus for fusion splicing a first optical fiber to a second optical fiber, wherein said electrical arc generates heat, and wherein said apparatus further comprises a fiber holding mechanism for holding said first optical fiber and said second optical fiber in a position wherein said heat is used to melt a portion of said first optical fiber and a portion of said second optical fiber to cause said first optical fiber to be bonded to said second optical fiber.

19. The apparatus according to claim 12, wherein said apparatus is an apparatus for preparing an optical fiber, wherein said electrical arc generates heat, and wherein said apparatus further comprises a fiber holding mechanism for holding said optical fiber in a position wherein said heat is used to remove coating material that is present on a portion of said optical fiber.

20. The apparatus according to claim 19, wherein said optical fiber includes at least one coating layer, wherein said preparing comprises cleaning said optical fiber, wherein said portion of said optical fiber is a stripped portion of said optical fiber formed by removing nearly all of said at least one coating layer from said portion of said optical fiber, and wherein said coating material comprises debris left on said stripped portion of said optical fiber after said nearly all of said at least one coating layer is removed from said portion of said optical fiber.

21. The apparatus according to claim 19, wherein said optical fiber includes at least one coating layer, wherein said preparing comprises stripping said optical fiber, and wherein said coating material that is present on said portion of said optical fiber that is removed comprises nearly all of said at least one coating layer that is present at said portion of said optical fiber.

22. The apparatus according to claim 12, wherein said ionizer device includes an ionizer circuit and a third electrode.

* * * * *

UNITED STATES PATENT AND TRADEMARK OFFICE
CERTIFICATE OF CORRECTION

PATENT NO. : 7,342,198 B2
APPLICATION NO. : 11/678671
DATED : March 11, 2008
INVENTOR(S) : Robert G. Wiley Page 1 of 1

It is certified that error appears in the above-identified patent and that said Letters Patent is hereby corrected as shown below:

Column 3, line 7, line 1, "position" should be --positioned--.
Column 6, line 18, "provide" should be --provided--.
Column 7, line 25, "is" should be --it--.
Column 8, line 9, "between the between the" should be --between the--.
Column 8, line 60, "provide" should be --provided--.
Column 11, line 45, "deice" should be --device--.
Column 14, line 11, "is" should be --it--. second occurrence Signed and Sealed this Twenty-eighth Day of October, 2008

JON W. DUDAS
*Director of the United States Patent and Trademark Office*